United States Patent
Hsu

(10) Patent No.: US 11,304,321 B2
(45) Date of Patent: Apr. 12, 2022

(54) LOCKING MECHANISM

(71) Applicant: PEGATRON CORPORATION, Taipei (TW)

(72) Inventor: Chun-Tang Hsu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 65 days.

(21) Appl. No.: 16/781,923

(22) Filed: Feb. 4, 2020

(65) Prior Publication Data
US 2020/0288591 A1 Sep. 10, 2020

(30) Foreign Application Priority Data
Mar. 8, 2019 (TW) ................................. 108107914

(51) Int. Cl.
*H05K 5/00* (2006.01)
*H05K 5/02* (2006.01)
*F16J 15/10* (2006.01)
*H05K 5/06* (2006.01)

(52) U.S. Cl.
CPC ............ *H05K 5/0221* (2013.01); *F16J 15/10* (2013.01); *H05K 5/0008* (2013.01); *H05K 5/069* (2013.01)

(58) Field of Classification Search
CPC .................................................. H05K 5/0008
See application file for complete search history.

(56) References Cited

U.S. PATENT DOCUMENTS

| 2015/0131221 | A1* | 5/2015 | Lin | G06F 1/1613 |
| | | | | 361/679.21 |
| 2017/0290173 | A1* | 10/2017 | Shoji | H05K 5/0217 |
| 2018/0124939 | A1* | 5/2018 | Hung | H04B 1/3888 |

FOREIGN PATENT DOCUMENTS

| CN | 103216514 | 7/2013 |
| CN | 104421308 | 3/2015 |
| CN | 104728253 | 6/2015 |
| CN | 105284195 | 1/2016 |
| CN | 206237710 | 6/2017 |
| EP | 1946694 | 7/2008 |
| TW | 412135 | 11/2000 |
| TW | I461611 | 11/2014 |
| TW | I544309 | 8/2016 |

* cited by examiner

*Primary Examiner* — Hung V Ngo
(74) *Attorney, Agent, or Firm* — J.C. Patents

(57) ABSTRACT

A locking mechanism includes a first shell, a second shell, a waterproof ring and a locking component. The first shell has a first carrying surface, a second carrying surface and an open hole. The second shell includes a fixing hole recessed in a third carrying surface. A diameter of the fixing hole is less than that of the open hole. The waterproof ring is clamped between the second and the third carrying surface. The locking component penetrates through the open hole, the waterproof ring and the fixing hole so as to be locked to the second shell. The locking component has a first and a second abutting surface. The first abutting surface abuts against the first carrying surface. The second abutting surface passes through the open hole to abut against the third carrying surface, so that the waterproof ring is pressed between the second and the third carrying surface.

10 Claims, 4 Drawing Sheets

LOCKING MECHANISM

CROSS REFERENCE TO RELATED APPLICATION

This application claims the priority benefit of Taiwan patent application serial no. 108107914, filed on Mar. 8, 2019. The entirety of the above-mentioned patent application is hereby incorporated by reference herein and made a part of specification.

BACKGROUND

Technical Field

The present disclosure relates to a locking mechanism, and particularly relates to a locking mechanism with a waterproof function.

Related Art

With the increasing popularity of mobile devices, diversified applications are driving manufacturers to continuously improve the tolerance of the mobile devices to different use situations. For example, an underwater camera module which can be equipped with a smart phone, a hand-held navigation device for field locating, and a physical monitoring device for personal use (such as a sports bracelet for monitoring heart rate) all require different levels of waterproof properties. In order to achieve a waterproof effect, such electronic devices require additional waterproof structures at both the seaming and locking positions of the shell.

Aiming at the waterproof design of the locking position of a shell, for example, in the locking process of the shell, a waterproof ring that sleeves the locking position is pressed and fixed between the shell and a screw head by a screw to prevent external moisture from intruding into the shell via a lock hole of the shell. However, in the process of locking the screw into a screw hole, the rotating torque of the screw easily causes deformation of the waterproof ring due to non-uniform stress under the compression of the screw head, and the waterproof ring is easily broken due to excessive compression of the screw head, resulting in failure of the waterproof function.

SUMMARY

The present disclosure provides a locking mechanism with an excellent waterproof function.

The locking mechanism of the present disclosure includes a first shell, a second shell, a waterproof ring and a locking component. The first shell has a first carrying surface, a second carrying surface opposite to the first carrying surface, and an open hole penetrating through the first carrying surface and the second carrying surface. The second shell has a third carrying surface facing the second carrying surface, and the second shell includes a fixing hole recessed in the third carrying surface. A diameter of the fixing hole is less than that of the open hole. The waterproof ring is clamped between the second carrying surface and the third carrying surface. The locking component penetrates through the open hole of the first shell, the waterproof ring and the fixing hole so as to be locked to the second shell. The locking component has a first abutting surface and a second abutting surface. The first abutting surface abuts against the first carrying surface. The second abutting surface passes through the open hole to abut against the third carrying surface, so that the waterproof ring is pressed between the second carrying surface and the third carrying surface.

Based on the above, in the locking mechanism according to an embodiment of the present disclosure, the waterproof ring clamped between the first shell and the second shell can prevent moisture from intruding into the shell from the outside of the shell via the locking mechanism. Furthermore, in the process of locking the first shell to the second shell, the locking component compresses the waterproof ring through the carrying surface of the first shell, thereby improving the uniformity of a force of the waterproof ring under compression. On the other hand, by means of an abutting relationship between the locking component and the second shell, the waterproof ring can be prevented from being broken due to excessive compression of the shell, thereby avoiding failure of the waterproof function.

To make the features and advantages of the present disclosure more comprehensible, a detailed description is made below with reference to the accompanying drawings by using embodiments.

DETAILED DESCRIPTION

Figure 1:
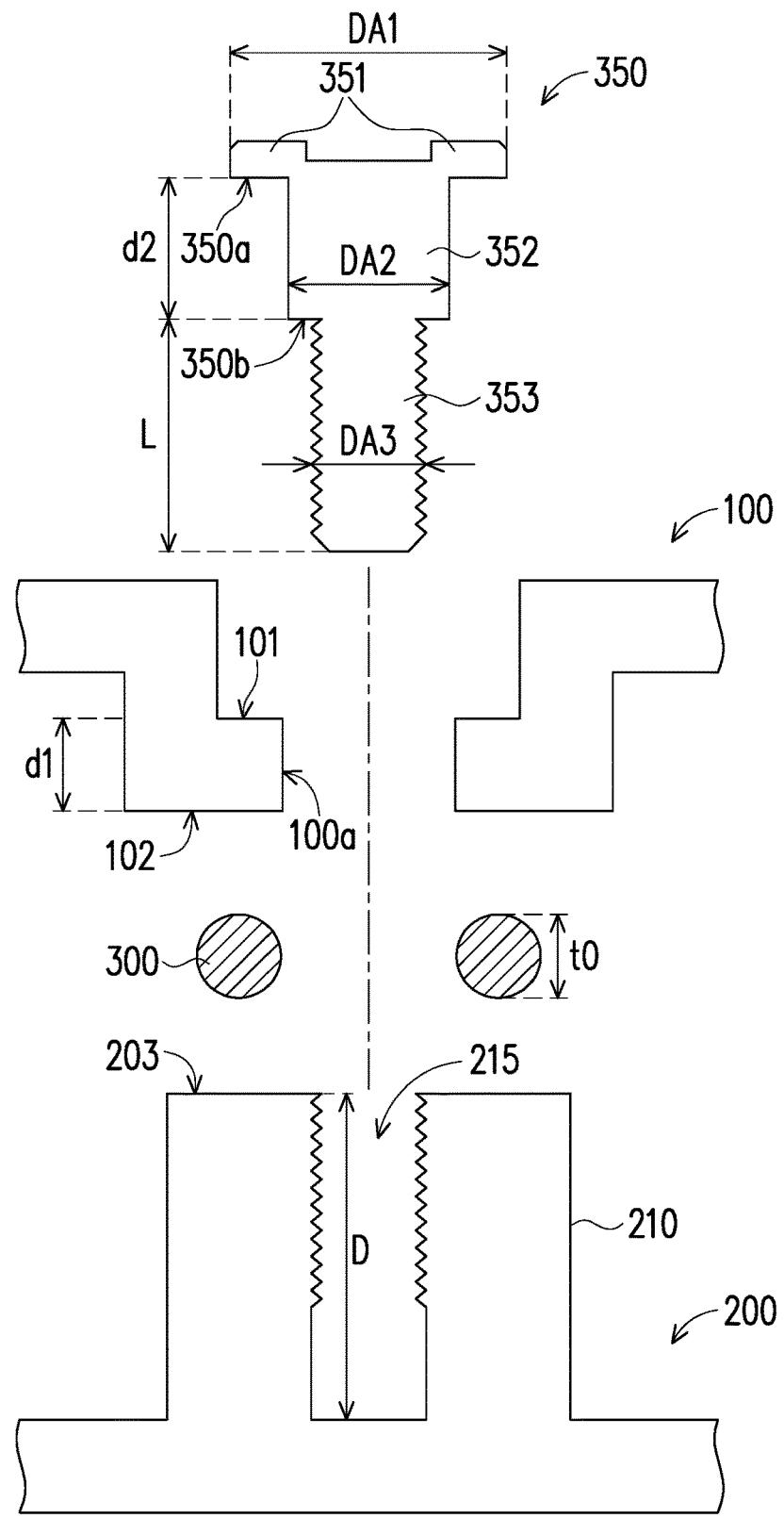
FIG. 1 is an exploded view of a locking mechanism according to an embodiment of the present disclosure.
Figure 2:
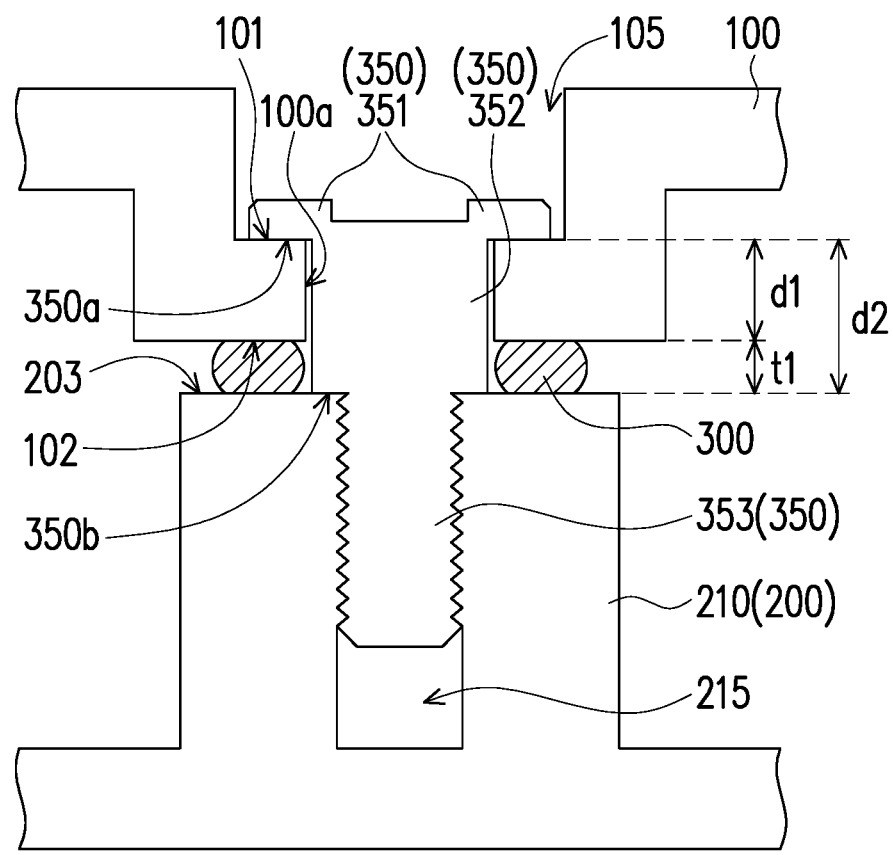
FIG. 2 is a schematic view of a locking mechanism according to an embodiment of the present disclosure.

FIG. 1 is an exploded view of a locking mechanism according to an embodiment of the present disclosure. FIG. 2 is a schematic view of a locking mechanism according to an embodiment of the present disclosure. Referring to FIG. 1 and FIG. 2, a locking mechanism 10 includes a first shell 100, a second shell 200, a waterproof ring 300 and a locking component 350. The waterproof ring 300 is clamped between the first shell 100 and the second shell 200, and the locking component 350 penetrates through the first shell 100 and the waterproof ring 300 so as to be locked to the second shell 200. In particular, the locking mechanism 10 may be applied to a smart phone, an underwater camera, a sports bracelet, or other electronic devices requiring the waterproof function. For example, in a smart phone adopting the locking mechanism 10, the first shell 100 may be a front cover, the second shell 200 may be a back cover, and a display module, a system board and a battery module may be arranged in an accommodation space between the two shells. By means of the arrangement of the waterproof ring 300, the locking mechanism 10 can prevent moisture from intruding into the accommodation space with the electronic components, through the locking mechanism of the shell, thereby affecting the operation electrical property of the smart phone.

Further, the first shell 100 has a first carrying surface 101, a second carrying surface 102 opposite to the first carrying surface 101, and an open hole 100*a* penetrating through the first carrying surface 101 and the second carrying surface 102. The locking component 350 penetrates through the open hole 100*a*, the first carrying surface 101 abuts against a portion of the locking component 350, and the second carrying surface 102 abuts against the waterproof ring 300. For example, the first shell 100 may optionally have a groove 105. The first carrying surface 101 is a bottom surface of the groove 105, and a portion of the locking component 350 may be positioned in the groove 105. However, the present disclosure is not limited thereto. Further, the locking component 350 has a first abutting surface 350a, and in the process of locking the locking component 350 to the second shell 200, the locking component 350 presses the first shell 100 and the waterproof ring 300 against the second shell 200 by means of an abutting relationship between the first abutting surface 350a and the first carrying surface 101.

On the other hand, the second shell 200 has a third carrying surface 203 facing the second carrying surface 102 and a fixing hole 215 recessed in the third carrying surface 203. The third carrying surface 203 abuts against the waterproof ring 300, the open hole 100a of the first shell 100 exposes a portion of the third carrying surface 203 and the fixing hole 215, and the locking component 350 passes through the open hole 100a of the first shell 100, the waterproof ring 300 and the fixing hole 215 so as to be locked to the second shell 200. In this embodiment, a diameter of the fixing hole 215 is less than a diameter of the open hole 100a. In particular, in the process of locking the locking component 350 to the second shell 200, the second carrying surface 102 of the first shell 100 is driven by means of the abutting relationship between the first carrying surface 101 and the first abutting surface 350a to compress the waterproof ring 300, and the waterproof ring 300 is pressed between the second carrying surface 102 and the third carrying surface 203 and generates a uniform compression set, so that a waterproof effect is ensured.

Further, the locking component 350 also has a second abutting surface 350b, and the second abutting surface 350b passes through the open hole 100a of the first shell 100 and the waterproof ring 300 to abut against the third carrying surface 203 of the second shell 200. In particular, in a normal direction of the second carrying surface 102, there is a first distance d1 between the first carrying surface 101 and the second carrying surface 102 of the first shell 100, and a second distance d2 exists between the first abutting surface 350a and the second abutting surface 350b of the locking component 350. The first distance d1 is less than the second distance d2. Therefore, in the process of locking the locking component 350 to the second shell 200, the waterproof ring 300 can be prevented from being broken due to excessive compression of the two shells (namely the first shell 100 and the second shell 200), so as to provide a stable waterproof function.

In this embodiment, the material of the waterproof ring 300 may include silica gel, rubber, a deformable material, or other elastic materials having a waterproof property. When the locking component 350 is fixed to the second shell 200, the waterproof ring 300 clamped between the second carrying surface 102 and the third carrying surface 203 has a compressed thickness t1 (as shown in FIG. 2) in the normal direction of the second carrying surface 102, and a difference value between the second distance d2 and the first distance d1 (|d1−d2|) may be substantially equal to the compressed thickness t1. However, the present disclosure is not limited thereto. In other embodiments, the difference value between the second distance d2 and the first distance d1 may also be less than the compressed thickness t1 of the waterproof ring 300.

From another point of view, the thickness compression of the waterproof ring 300 can be determined by subtracting the difference value between the first distance d1 and the second distance d2 from the initial thickness t0 (as shown in FIG. 1) of the waterproof ring 300. In other words, the difference value between the first distance d1 and the second distance d2 can be adjusted according to the material type and the outer diameter of the waterproof ring 300, so as to facilitate the waterproof property and a lifetime of a waterproof component. In this embodiment, the compressed thickness t1 of the waterproof ring 300 may be less than the initial thickness t0, but the present disclosure is not limited thereto. In other embodiments, the compressed thickness t1 of the waterproof ring 300 may also be substantially equal to the initial thickness t0 of the waterproof ring 300. That is, the material of the waterproof ring 300 may also be a material which has poor elasticity but has a waterproof property.

Further, the second shell 200 may also optionally have a convex pillar 210, and the convex pillar 210 has a third carrying surface 203 and a fixing hole 215. For example, the locking component 350 may include a limiting part 351 positioned outside the open hole 100a, a locating part 352 and a fixing part 353, and the locating part 352 is connected between the limiting part 351 and the fixing part 353. The limiting part 351 of the locking component 350 has a first abutting surface 350a, the locating part 352 has a second abutting surface 350b, and the fixing part 353 is locked into the fixing hole 215 of the convex pillar 210 from the third carrying surface 203. In particular, the limiting part 351 has a first outer diameter DA1, the locating part 352 has a second outer diameter DA2, and the fixing part 353 has a third outer diameter DA3. The first outer diameter DA1 is greater than the second outer diameter DA2, so that the limiting part 351 can have a first abutting surface 350a for abutting against the first carrying surface 101. The second outer diameter DA2 is greater than the third outer diameter DA3, so that the locating part 352 can have a second abutting surface 350b for abutting against the third carrying surface 203. However, the present disclosure is not limited thereto.

In this embodiment, the locking component 350 may be, for example, a screw. That is, the limiting part 351, the locating part 352 and the fixing part 353 of the locking component 350 may respectively be a screw head, a stud part and a threaded part of the screw. For example, an outer surface of the fixing part 353 of the locking component 350 may be provided with external threads, an inner surface of the fixing hole 215 of the convex pillar 210 of the second shell 200 may be provided with internal threads, and the locking component 350 may be locked to the second shell 200 by means of a cooperative relationship between the fixing part 353 and the fixing hole 215. However, the present disclosure is not limited thereto. On the other hand, the fixing part 353 has a length L, the fixing hole 215 has a depth D (as shown in FIG. 1), and the depth D of the fixing hole 215 may be greater than the length L of the fixing part 353. In some embodiments, a difference value between the depth D of the fixing hole 215 and the length L of the fixing part 353 (depth D-length L) may be greater than or equal to 0.5 mm. Therefore, in the process of locking the locking component 350 into the fixing hole 215, the bottom surface of the fixing hole 215 can be prevented from being broken due to the pressing of the fixing part 353 so as to prevent the moisture from intruding into the shell. Furthermore, when the moisture intrudes into a gap between the locking component 350 and the shell, a reserved space in the fixing hole 215 is allowed to accumulate the moisture so as to prevent excessive moisture from remaining at the periphery of the waterproof ring 300.

The disclosure will be explained in detail with other embodiments below. The same components are marked by the same symbols, and the description of the same technical contents is omitted. Please refer to the above embodiments for the omitted portions and the descriptions thereof are omitted herein.

Figure 3:
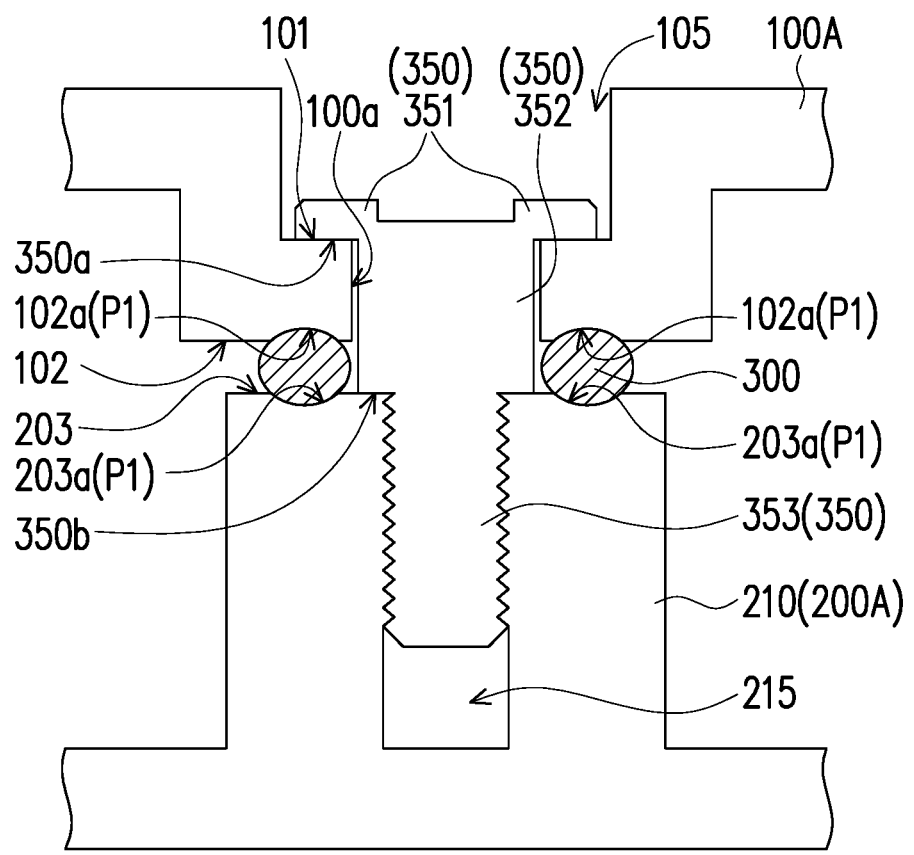
FIG. 3 is a schematic view of a locking mechanism according to another embodiment of the present disclosure.

FIG. 3 is a schematic view of a locking mechanism according to another embodiment of the present disclosure. Referring to FIG. 3, the locking mechanism 10A of this embodiment is substantially similar to the locking mechanism 10 of the previous embodiment in design principle. The main difference between the locking mechanism 10A and the locking mechanism 10 is the structural design of a first shell 100A and a second shell 200A. In this embodiment, the locking mechanism 10A further includes a locating structure P1 matched with the waterproof ring 300. The locating structure P1 may be, for example, a locating recess 102a arranged on the second carrying surface 102 of the first shell 100A and a locating recess 203a arranged on the third carrying surface 203 of the second shell 200A. Portions of the waterproof ring 300 are respectively positioned in the locating recess 102a and the locating recess 203a. However, the present disclosure is not limited thereto. In other embodiments, the locating recess of the locking mechanism may also be only arranged on one of the second carrying surface 102 and the third carrying surface 203. Therefore, the waterproof ring 300 can be prevented from sliding perpendicular to the compression direction in the compression process, so as to provide a stable and reliable waterproof function.

Figure 4:
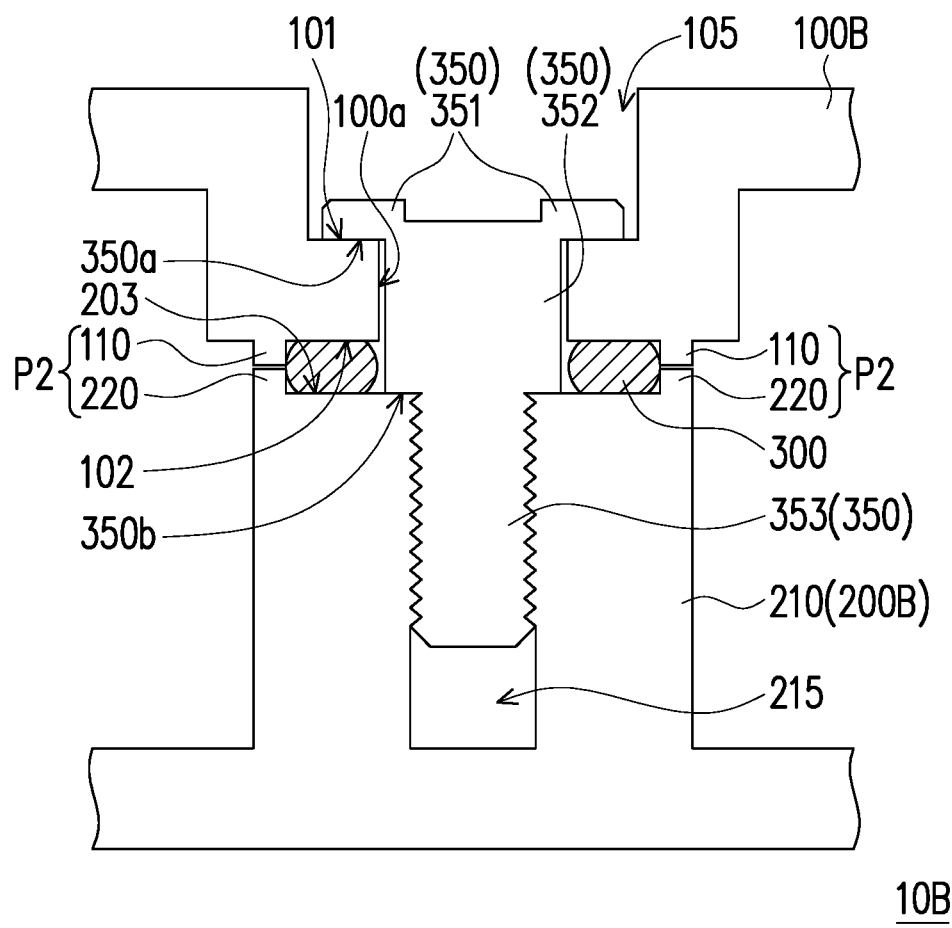
FIG. 4 is a schematic view of a locking mechanism according to another embodiment of the present disclosure.

FIG. 4 is a schematic view of a locking mechanism according to another embodiment of the present disclosure. Referring to FIG. 4, the locking mechanism 10B of this embodiment is substantially similar to the locking mechanism 10A of the previous embodiment in design principle, and the main difference between the locking mechanism 10B and the locking mechanism 10A is the design of a locating structure P2. In this embodiment, the locating structure P2 may be, for example, a locating bump 110 arranged on the second carrying surface 102 of the first shell 100B and a locating bump 220 arranged on the third carrying surface 203 of the second shell 200B. The waterproof ring 300 is arranged between the locating structure P2 and the locking component 350. However, the present disclosure is not limited thereto. In other embodiments, the locating bump of the locking mechanism may also be only arranged on one of the second carrying surface 102 and the third carrying surface 203. Therefore, the waterproof ring 300 can be prevented from sliding perpendicular to the compression direction in the compression process, so as to provide a stable and reliable waterproof function.

Based on the above, in the locking mechanism according to an embodiment of the present disclosure, the waterproof ring clamped between the first shell and the second shell can prevent moisture from intruding into the shell from the outside of the shell via the locking mechanism. Furthermore, in the process of locking the first shell to the second shell, the locking component compresses the waterproof ring through the carrying surface of the first shell, thereby improving the uniformity of a force of the waterproof ring under compression. On the other hand, by means of the abutting relationship between the locking component and the second shell, the waterproof ring can be prevented from being broken due to excessive compression of the shell, thereby avoiding failure of the waterproof function. Further, by arranging the locating structure on the carrying surface of the shell for abutting against the waterproof ring, the waterproof ring can be prevented from sliding perpendicular to the compression direction in the compression process, thereby being favorable for providing a stable and reliable waterproof function.

Although the present disclosure is described with reference to the above embodiments, the embodiments are not intended to limit the present disclosure. A person of ordinary skill in the art may make variations and modifications without departing from the spirit and scope of the present disclosure. Therefore, the protection scope of the present disclosure should be subject to the appended claims.

What is claimed is:

1. A locking mechanism, comprising:
   a first shell, having a first carrying surface, a second carrying surface opposite to the first carrying surface, and an open hole penetrating through the first carrying surface and the second carrying surface;
   a second shell, having a third carrying surface facing the second carrying surface and comprising a fixing hole recessed in the third carrying surface, wherein a diameter of the fixing hole is less than a diameter of the open hole;
   a waterproof ring, clamped between the second carrying surface and the third carrying surface; and
   a locking component, penetrating through the open hole of the first shell, the waterproof ring and the fixing hole sequentially so as to be locked to the second shell and having a first abutting surface and a second abutting surface, wherein the first abutting surface abuts against the first carrying surface, and the second abutting surface passes through the open hole to abut against the third carrying surface, so that the waterproof ring is pressed between the second carrying surface and the third carrying surface,
   wherein a first distance between the first carrying surface and the second carrying surface is less than a second distance between the first abutting surface and the second abutting surface.

2. The locking mechanism according to claim 1, wherein the locking component comprises a limiting part, a locating part and a fixing part, the limiting part is positioned outside the open hole, the locating part and the fixing part passes through the open hole and the waterproof ring, the locating part is positioned between the limiting part and the fixing part, the limiting part has the first abutting surface, the locating part has the second abutting surface, and the fixing part is locked into the fixing hole of the second shell from the third carrying surface.

3. The locking mechanism according to claim 2, wherein the fixing part has a length, the fixing hole has a depth, and the depth of the fixing hole is greater than the length of the fixing part.

4. The locking mechanism according to claim 2, wherein the limiting part has a first outer diameter, the locating part has a second outer diameter, the fixing part has a third outer diameter, the first outer diameter is greater than the second outer diameter, and the second outer diameter is greater than the third outer diameter.

5. The locking mechanism according to claim 1, further comprising: a locating structure which is matched with the waterproof ring and is arranged on at least one of the second carrying surface and the third carrying surface.

6. The locking mechanism according to claim 5, wherein the locating structure comprises at least one locating recess, and at least a portion of the waterproof ring is located in the at least one locating recess.

7. The locking mechanism according to claim 5, wherein the locating structure comprises at least one locating bump, and the waterproof ring is arranged between the at least one locating bump and the locking component.

8. The locking mechanism according to claim 1, wherein the waterproof ring has an initial thickness, the waterproof ring clamped between the second carrying surface and the third carrying surface has a compressed thickness, and the compressed thickness is less than the initial thickness.

9. The locking mechanism according to claim 8, wherein a difference value between the second distance and the first distance is equal to the compressed thickness.

10. The locking mechanism according to claim 1, wherein the first shell further has a groove, the first carrying surface is a bottom surface of the groove, and the locking component is partially positioned in the groove.

* * * * *